US012665503B2

(12) United States Patent
Tuikkanen et al.

(10) Patent No.: US 12,665,503 B2
(45) Date of Patent: Jun. 23, 2026

(54) LOW NOISE CHARGE PUMP CIRCUIT

(71) Applicant: TEXAS INSTRUMENTS INCORPORATED, Dallas, TX (US)

(72) Inventors: Tuomas Tuikkanen, Oulu (FI); Markus Siljander, Oulu (FI); Mikko Loikkanen, Oulu (FI)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/449,022

(22) Filed: Aug. 14, 2023

(65) Prior Publication Data

US 2025/0062685 A1     Feb. 20, 2025

(51) Int. Cl.
H02M 3/07 (2006.01)
H03K 19/0185 (2006.01)
(52) U.S. Cl.
CPC ...... H02M 3/07 (2013.01); H03K 19/018507 (2013.01)

(58) Field of Classification Search
CPC ........................ H02M 3/07; H03K 19/018507
See application file for complete search history.

(56) References Cited

U.S. PATENT DOCUMENTS

| | | | | |
|---|---|---|---|---|
| 2007/0229146 A1* | 10/2007 | Fukuda | ................. | H02M 3/073 |
| | | | | 327/536 |
| 2010/0097125 A1* | 4/2010 | Ji | ........................... | H02M 3/073 |
| | | | | 327/536 |
| 2019/0312514 A1* | 10/2019 | Hukel | ..................... | H02M 3/07 |
| 2020/0012304 A1* | 1/2020 | Saha | ..................... | G05F 1/5735 |

* cited by examiner

*Primary Examiner* — Sibin Chen
(74) *Attorney, Agent, or Firm* — Frank D. Cimino

(57) ABSTRACT

A charge pump circuit includes first and second capacitors, first, second, third and fourth switches, and a transistor. The first switch is coupled between a top plate of the first capacitor and a first voltage input terminal. The second switch is coupled between a bottom plate of the first capacitor and a reference voltage terminal. The third switch is coupled between the top plate of the first capacitor and a top plate of the second capacitor. The transistor and the fourth switch are coupled in series between the bottom plate of the first capacitor and a second voltage input terminal.

25 Claims, 5 Drawing Sheets

LOW NOISE CHARGE PUMP CIRCUIT

BACKGROUND

Many electronic circuits apply multiple operational voltages. In some such circuits, a charge pump circuit may be used to generate an operational voltage. For example, in a circuit that applies a first voltage and a second voltage that is greater than the first voltage, a charge pump circuit may be used to generate the second voltage from the first voltage. Charge pump circuits use switched capacitors to convert an input voltage to an output voltage that may be higher than, or negative relative to, the input voltage. In a charge pump circuit, switches coupled to a capacitor are operated in sequence to first charge the capacitor from the input voltage and then transfer the charge to the output.

SUMMARY

In one example, a charge pump circuit includes first and second capacitors, first, second, third and fourth switches, and a transistor. The first switch is coupled between a top plate of the first capacitor and a first voltage input terminal. The second switch is coupled between a bottom plate of the first capacitor and a reference voltage terminal. The third switch is coupled between the top plate of the first capacitor and a top plate of the second capacitor. The transistor and the fourth switch are coupled in series between the bottom plate of the first capacitor and a second voltage input terminal.

In another example, a charge pump circuit includes a first and second capacitors, first and second switches, and a threshold level shift circuit. The first switch is coupled between a top plate of the first capacitor and a first voltage input terminal. The second switch is coupled between the top plate of the first capacitor and a top plate of the second capacitor. The threshold level shift circuit is coupled between the first switch and a reference voltage terminal. The threshold level shift circuit includes a proportional-to-absolute-temperature (PTAT) current source and a current mirror circuit. The current mirror circuit includes a control transistor and a mirror transistor. The mirror transistor is coupled between the first switch and the reference voltage terminal. The control transistor is coupled between the PTAT current source and the reference voltage terminal.

In a further example, a circuit includes a first transistor, an amplifier, and a charge pump circuit. The first transistor is coupled between a power input terminal and a power output terminal. The first transistor has a first control terminal. The amplifier has a first amplifier input, a second amplifier input, and an amplifier output. The first amplifier input is coupled to the power output terminal. The second amplifier input is coupled to a reference voltage circuit. The charge pump circuit includes first and second capacitors, first, second, third, and fourth switches, a second transistor, and a clock generator. The first capacitor has a first top plate and a first bottom plate. The second capacitor has a second top plate and a second bottom plate. The second top plate is coupled to the first control terminal. The first switch is coupled between the first top plate and the power output terminal. The first switch has a first control input. The second switch is coupled between the first bottom plate and a reference voltage terminal. The second switch has a second control input. The third switch is coupled between the first top plate and the second top plate. The third switch has a third control input. The second transistor and the fourth switch are coupled in series between the first bottom plate and a voltage input terminal. The fourth switch has a fourth control input.

The clock generator has first, second, and third clock phase outputs. The first clock phase output is coupled to the first control input and the second control input. The second clock phase output is coupled to the fourth control input. The third clock phase output is coupled to the third control input.

BRIEF DESCRIPTION OF THE DRAWINGS

For a detailed description of various examples, reference will now be made to the accompanying drawings in which.

DETAILED DESCRIPTION

Figure 1:
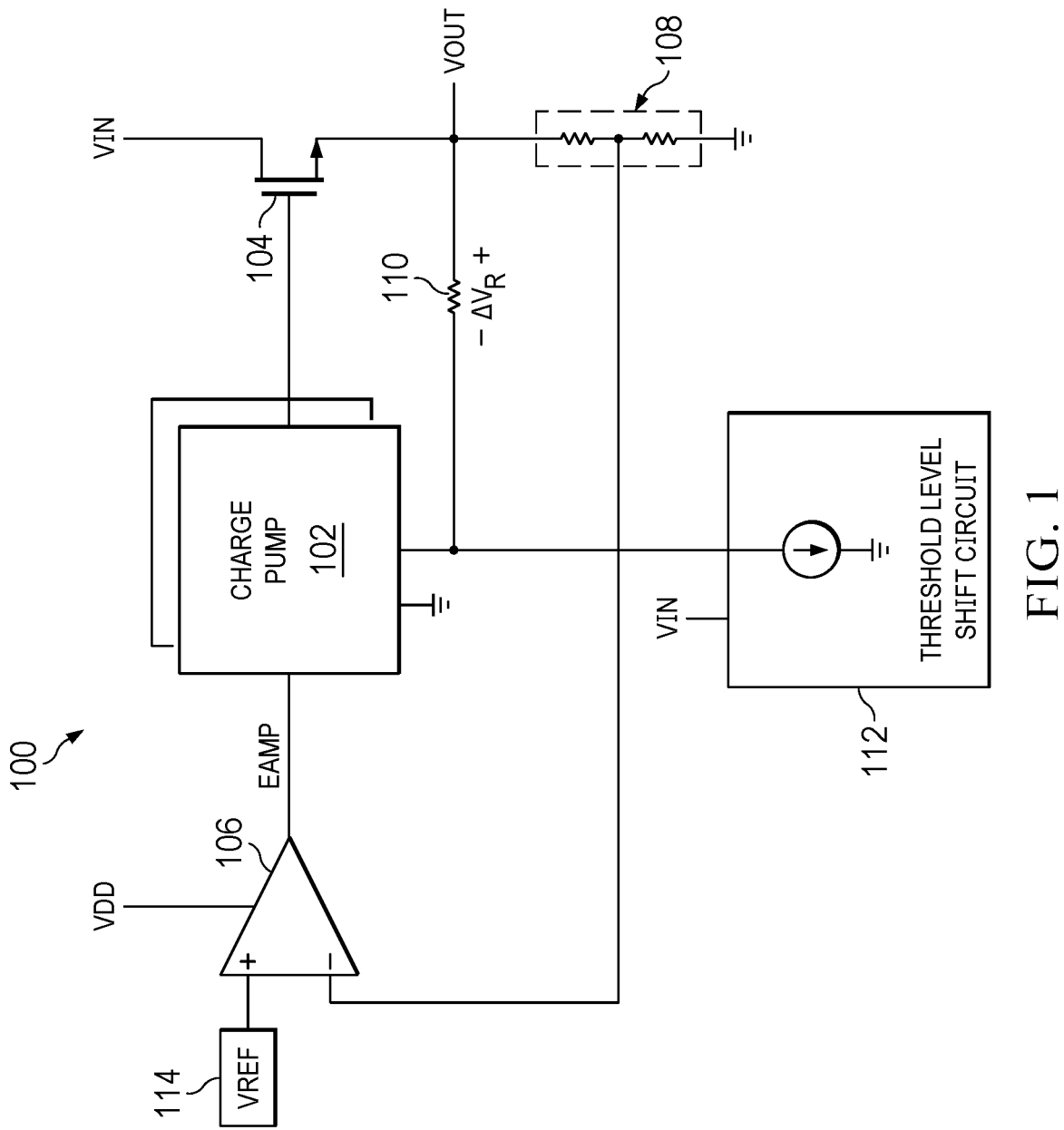
FIG. 1 is a block diagram of an example voltage regulator circuit that includes a low-noise charge pump circuit.

FIG. 1 is a block diagram of an example voltage regulator circuit 100. The voltage regulator circuit 100 includes a charge pump circuit 102, a pass transistor 104, an error amplifier 106, and a threshold level shift circuit 112. The voltage regulator circuit 100 is coupled between a power input terminal (VIN) and a power output terminal (VOUT). A first current terminal (e.g., drain) of the pass transistor 104 is coupled to the power input terminal, and a second current terminal (e.g., source) of the pass transistor 104 is coupled to the power output terminal. The pass transistor 104 may be an n-channel field effect transistor (NFET). The error amplifier 106 generates an error signal (EAMP) representing a difference of voltage regulator output voltage and a reference voltage. A first amplifier input (e.g., inverting input) of the error amplifier 106 is coupled to the power output terminal via a voltage divider 108. A second amplifier input (e.g., non-inverting input) is coupled to a reference voltage circuit 114.

The charge pump circuit 102 is coupled between the error amplifier 106 and the pass transistor 104. An output of the charge pump circuit 102 is coupled to a control terminal (e.g., gate) of the pass transistor 104. The charge pump circuit 102 provides an output voltage that is a sum on the output of the error amplifier 106 (EAMP) and the output of the voltage regulator circuit 100 (VOUT) to drive the pass transistor 104. The charge pump circuit 102 includes a first voltage input coupled to the amplifier output of the error amplifier 106 and a second voltage input coupled to the power output terminal of the voltage regulator circuit 100 via a resistor 110. Some implementations of the voltage regulator circuit 100 may include two instances of the charge pump circuit 102 coupled in parallel.

The threshold level shift circuit 112 is coupled between the second voltage input of the charge pump circuit 102 and a ground terminal. The threshold level shift circuit 112 draws current through the resistor 110 to modulate the voltage at the second voltage input terminal to compensate for leakage and variations in the threshold of the pass transistor 104, especially at high temperatures.

In some voltage regulator circuits, the error amplifier presents a relatively high impedance load to the charge pump circuit causing not only charge pump ripple but also the charge pump capacitor charging noise to appear at the control terminal of the pass transistor and ultimately at the power output terminal of the voltage regulator circuit. Some applications are sensitive to noise in a frequency range of charge pump switching. Reducing charge pump ripple present at the power output terminal is important in such applications.

In some examples of the voltage regulator circuit 100, two interleaved instances of the charge pump circuit 102 operate 180° out of phase to drive the control terminal of the pass transistor 104. The charge pump circuit 102 employs three-phase clocking. In a first phase, a charge pump capacitor is charged based on VOUT. In a second phase, the capacitor bottom plate is precharged to a voltage near EAMP without loading the error amplifier 106. In the third phase, the capacitor bottom plate is charged to EAMP, and the charge of the capacitor is transferred to a holding capacitor to drive the control terminal of the pass transistor 104. Accordingly, the charge pump circuit 102 reduces charge pump switching noise by reducing loading of the error amplifier 106.

Figure 2:
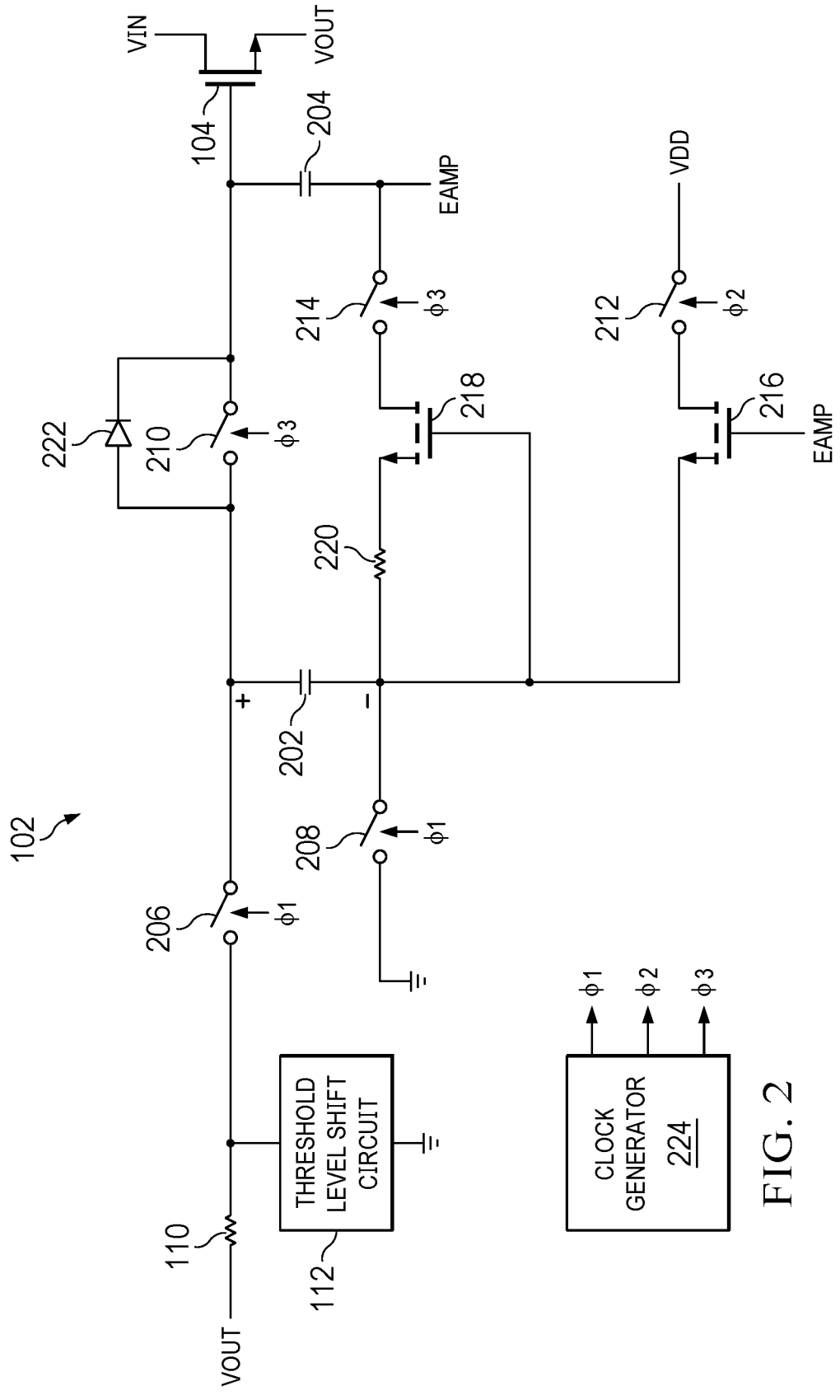
FIG. 2 is a schematic diagram of an example low-noise charge pump circuit suitable for use in the voltage regulator circuit of FIG. 1.

FIG. 2 is a schematic diagram of an example charge pump circuit 102. The charge pump circuit 102 includes capacitors 202 and 204, switches 206, 208, 210, 212, and 214, transistors 216 and 218, resistor 220, diode 222, and clock generator 224. The pass transistor 104, the resistor 110, and the threshold level shift circuit 112 are also shown in FIG. 2. In some implementations, the threshold level shift circuit 112 may be part of the charge pump circuit 102.

The transistors 216 and 218 may be natural field effect transistors. The switches 206, 208, 210, 212, and 214 may be implemented using field effect transistors. Control inputs of the switches 206, 208, 210, 212, and 214 are coupled to outputs of the clock generator 224. Switch control inputs of the switches 206 and 208 are coupled to a φ1 output of the clock generator 224. Switch control inputs of the switches 210 and 214 are coupled to a φ3 output of the clock generator 224. A switch control input of the switch 212 is coupled to a φ2 output of the clock generator 224.

The switch 206 is coupled between the resistor 110 (coupled to VOUT via the resistor 110) and the top plate of the capacitor 202. The switch 208 is coupled between the bottom plate of the capacitor 202 and a reference voltage terminal (e.g., a ground terminal). The switch 210 is coupled between the top plate of the capacitor 202 and the top plate of the capacitor 204. An anode of the diode 222 is coupled to the top plate of the capacitor 202, and a cathode of the diode 222 is coupled to the top plate of the capacitor 204. The top plate of the capacitor 204 is also coupled to the control terminal of the pass transistor 104.

The transistor 216 and the switch 212 are coupled in series between the bottom plate of the capacitor 202 and a voltage input terminal (VDD). A control terminal of the transistor 216 is coupled to the amplifier output of the error amplifier 106.

The switch 214, the transistor 218, and the resistor 220 are coupled in series between the bottom plate of the capacitor 202 and the amplifier output of the error amplifier 106. The resistor 220 and the transistor 218 form a floating current source that may be optional in some implementations of the charge pump circuit 102. The resistor 220 is coupled between the bottom plate of the capacitor 202 and a current terminal (e.g., source) of the transistor 218. The transistor 218 is coupled between the resistor 220 and the switch 214. The switch 214 is coupled between the transistor 218 and the amplifier output of the error amplifier 106. A control terminal of the transistor 218 is coupled to the bottom plate of the capacitor 202.

Figure 3:
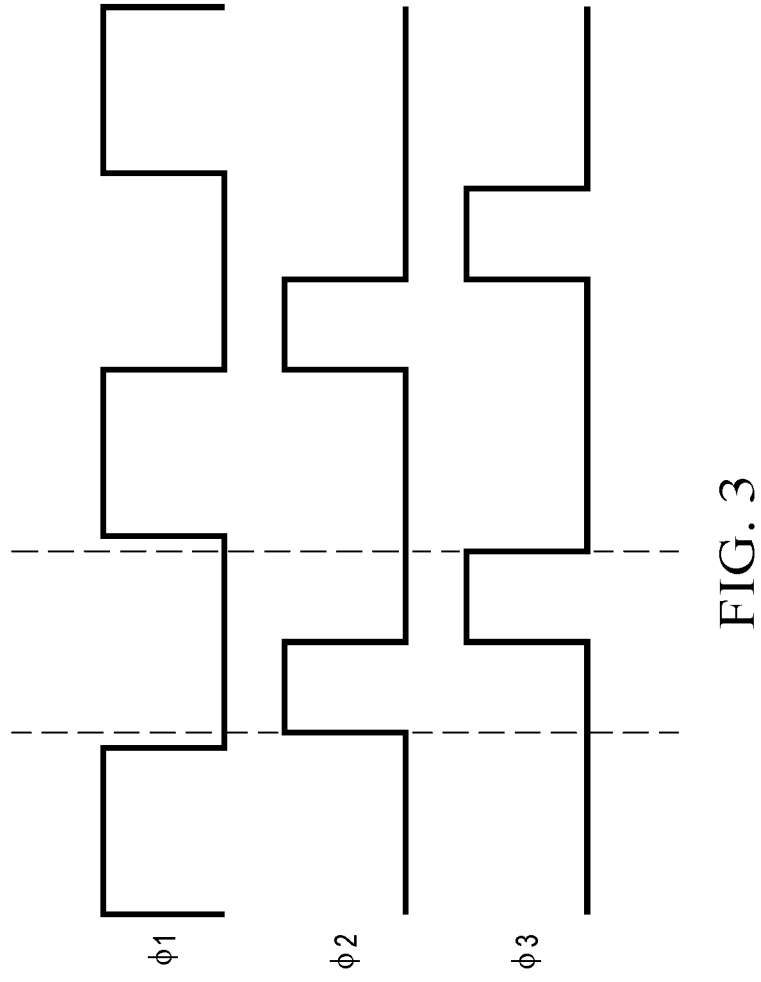
FIG. 3 is a timing diagram of example clock signals used in the charge pump circuit of FIG. 2.

FIG. 3 is a timing diagram of example clock signals generated by the clock generator 224. The clock signals φ1, φ2, and φ3 are non-overlapping. When φ1 is active (e.g., logic high), the switches 206 and 208 are closed, and the capacitor 202 is charged to VOUT, or approximately VOUT with adjustment due to the threshold level shift circuit 112, which will be further explained below. The switches 210, 212, and 214 are open when φ1 is active.

When φ2 is active (e.g., logic high), the switch 212 is closed and current flows through the transistor 216 to charge the bottom plate of the capacitor 202 to about VDD, which may be a slightly lower voltage than EAMP. By precharging the bottom plate of the capacitor 202 to VDD, the charge pump circuit 102 reduces loading of the error amplifier 106 (e.g., reduces the current drawn from the error amplifier 106). The switches 206, 208, 210, and 214 are open when φ2 is active.

When φ3 is active, the switches 210 and 212 are closed. The bottom plate of the capacitor 202 is charged to EAMP through the switch 214, the transistor 218 and the resistor 220. Charge is transferred from the capacitor 202 to the capacitor 204 through the switch 210. Because the bottom plate of the capacitor 202 is precharged to a voltage near EAMP in φ2, the current drawn from the error amplifier 106 in φ3 to complete the charging of the bottom plate of the capacitor 202 is substantially reduced relative to charging the bottom plate of the capacitor 202 solely using EAMP. Reducing the current drawn from the error amplifier 106, reduces the noise at the output of the error amplifier 106.

Figure 4:
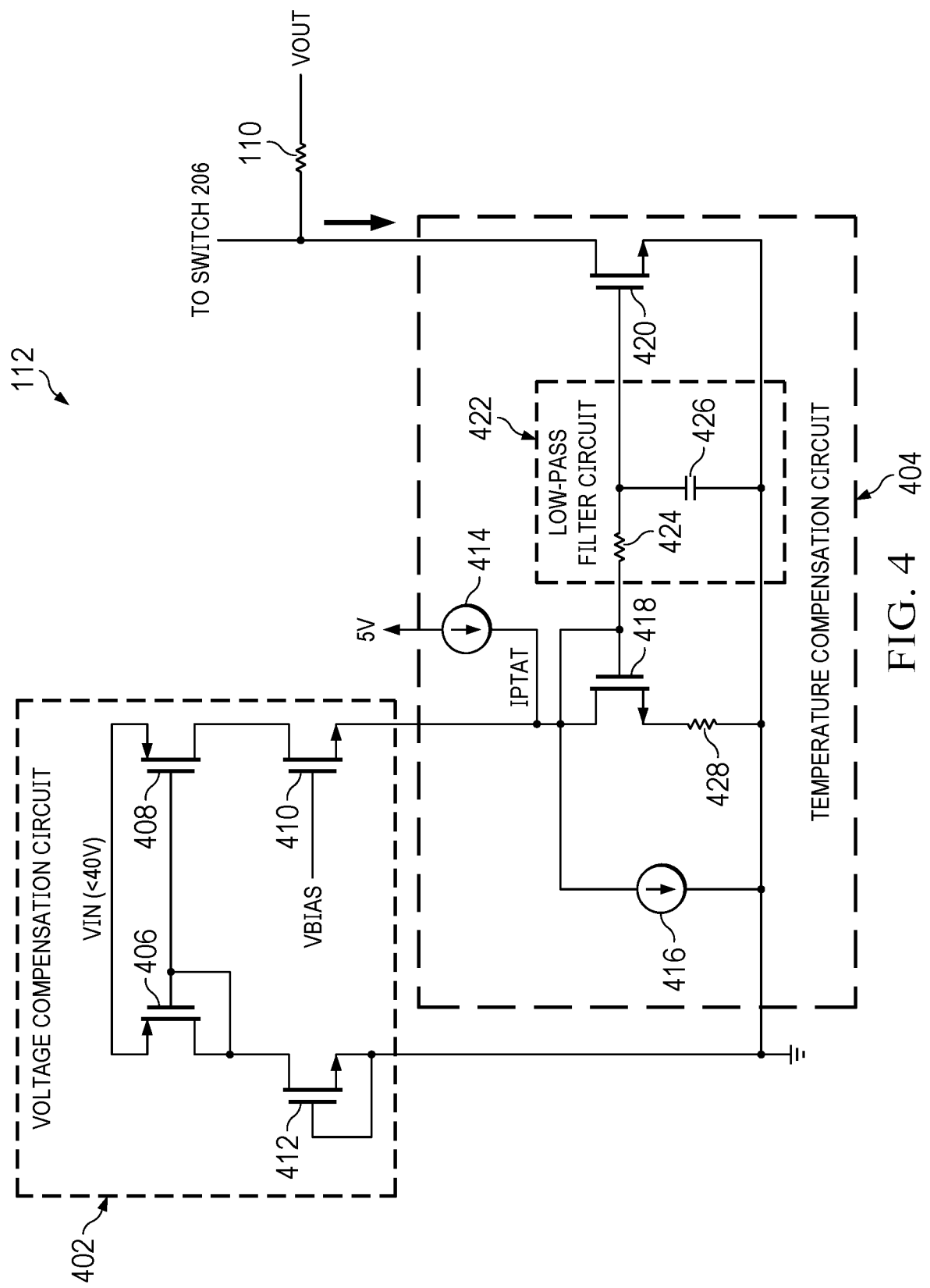
FIG. 4 is a schematic diagram of an example threshold level shift circuit suitable for use with the charge pump circuit of FIG. 2.

FIG. 4 is a schematic diagram of an example threshold level shift circuit 112. The threshold level shift circuit 112 adjusts the voltage provided to the capacitor 202 when φ1 is active to compensate for leakage and threshold variations in the pass transistor 104. The threshold level shift circuit 112 includes a voltage compensation circuit 402 and a temperature compensation circuit 404. The voltage compensation circuit 402 includes the transistors 406, 408, 410, and 412. The transistors 406 and 408 may be p-channel field effect transistors (PFETs), and the transistors 410 and 412 may be NFETs. The transistor 406 and the transistor 408 are connected as a current mirror circuit. The transistor 406 serves as a control transistor, and the transistor 408 serves as a mirror transistor. A first current terminal (e.g., source) of the transistor 406 is coupled to a first current terminal (e.g., source) of the transistor 408 and to the power terminal. A control terminal of the transistor 406 is coupled to a control terminal of the transistor 408 and to a second current terminal of the transistor 406. The transistor 412 is coupled between the transistor 406 and the ground terminal. A first current terminal (e.g., drain) of the transistor 412 is coupled to the second current terminal of the transistor 406. A second current terminal of the transistor 412 and a control terminal of the transistor 412 are coupled to the ground terminal. The leakage current of the transistor 412 flows through the transistor 406, and is mirrored through the transistor 408 and the transistor 410. The transistor 410 is a cascode, and is coupled between the transistor 408 and the temperature compensation circuit 404. A first current terminal (e.g., drain) of the transistor 410 is coupled to a second current terminal (e.g., drain) of the transistor 408. A control terminal (e.g., gate) of the transistor 410 is coupled to a bias voltage circuit (not shown). A second current terminal (e.g., source) of the transistor 410 is coupled to the ground terminal through the temperature compensation circuit 404.

The temperature compensation circuit 404 includes a proportional-to-absolute-temperature (PTAT) current source 414, a trim current source 416, and transistors 418 and 420. The transistors 418 and 420 may be NFETs. The transistor 418 and the transistor 420 are connected as current mirror circuit. The transistor 418 serves as a control transistor, and the transistor 420 serves as a mirror transistor. The transistor 418 is coupled between the second current terminal of the transistor 410 and the ground terminal. A first current terminal of the transistor 418 is coupled to the second current terminal of the transistor 410 and the output of the PTAT current source 414. A second current terminal (e.g., source) of the transistor 418 is coupled to the ground terminal through the resistor 428. The transistor 420 is coupled between the resistor 110 and the ground terminal. A first current terminal (e.g., drain) of the transistor 420 is coupled to the resistor 110, and a second current terminal (e.g., drain) of the transistor 420 is coupled to the ground terminal. A control terminal (e.g., gate) of the transistor 420 is coupled to a control terminal (e.g., gate) of the transistor 418.

The temperature compensation circuit 404 may also include a low-pass filter circuit 422 coupled between the control terminals of the transistor 418 and the transistor 420. The low-pass filter circuit 422 may include a resistor 424, and a capacitor 426. The resistor 424 is coupled between the control terminals of the transistor 418 and the transistor 420, and the capacitor 426 is coupled between a ground terminal and the control terminal of the transistor 420.

The PTAT current source 414 provides a PTAT current (IPTAT) that flows through the transistor 418 and the trim current source 416 in addition to the current flowing through the transistor 408 and the transistor 410. The trim current source 416 is coupled between the first current terminal of the transistor 418 and the ground terminal. The current conducted by the trim current source 416 may be set during manufacture of the threshold level shift circuit 112 to trim the current flowing through the transistor 420 to zero at a selected temperature. The current flowing through the transistor 418 is mirrored through the transistor 420 to adjust the voltage provided to the capacitor 202 during φ1.

Figure 5:
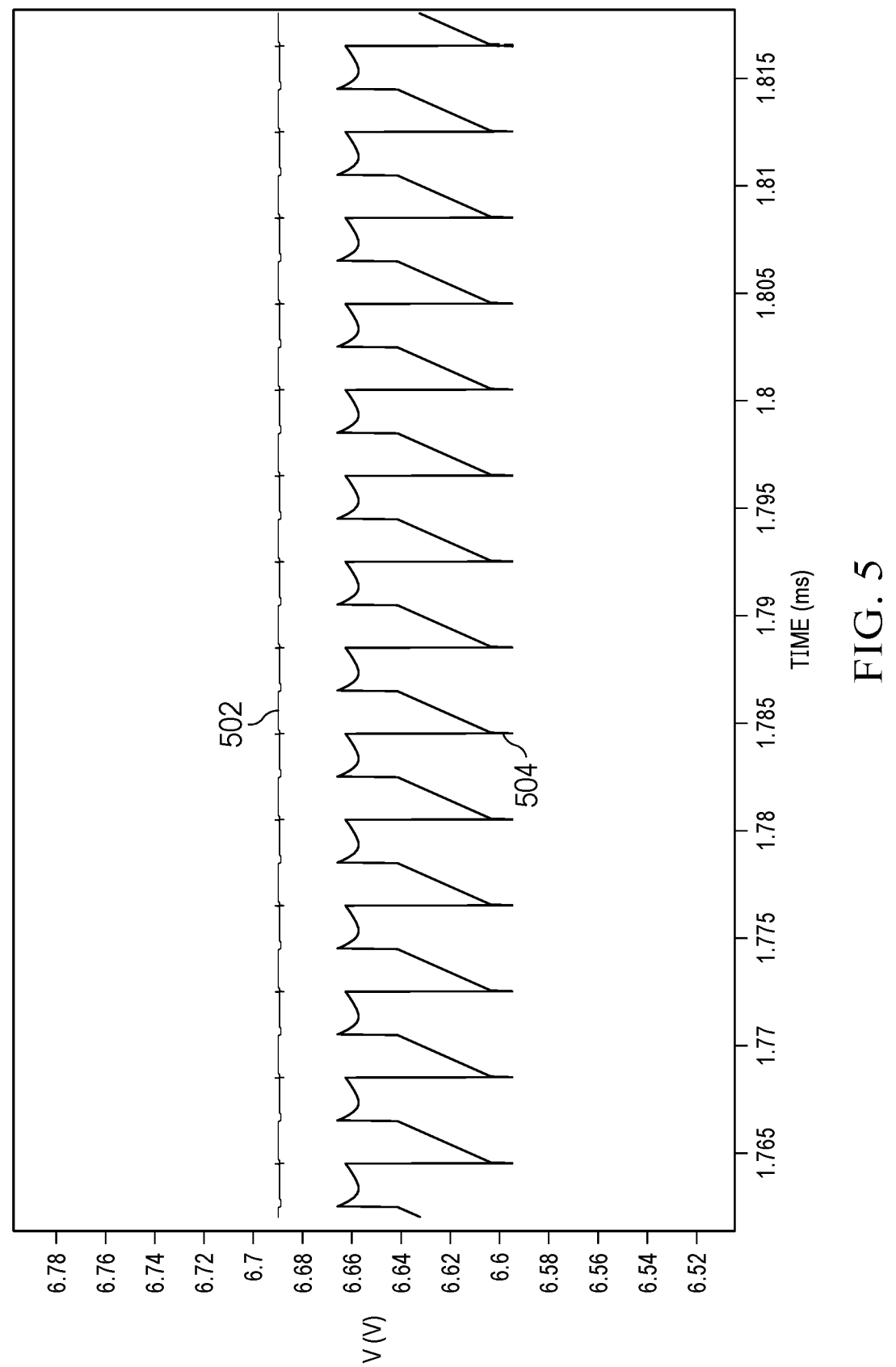
FIG. 5 is a graph comparing output noise of an example of the charge pump circuit of FIG. 2 and a conventional charge pump circuit.

FIG. 5 is a graph comparing output noise of an example of the charge pump circuit 102 and a conventional charge pump circuit. FIG. 5 shows the voltage 502 at the output of the charge pump circuit 102, and the voltage 504 at the output of a conventional charge pump circuit. The voltage 502 includes about 2 millivolts peak-to-peak of noise, while the voltage 504 includes about 71 millivolts peak-to-peak of noise. Accordingly, the noise generated by the charge pump circuit 102 is much lower than the noise generated by the conventional charge pump circuit, and in-turn, the noise at the output of the voltage regulator circuit 100 can be substantially lower using the charge pump circuit 102 than with a conventional charge pump circuit.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "ON" or "enabled" means that the conduction channel of the FET is present and drain current may flow through the FET. References herein to a FET being "OFF" or "disabled" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. A charge pump circuit, comprising:
a first switch coupled between a first input and a first capacitor terminal;
a second switch coupled between a second capacitor terminal and a first reference terminal;
a third switch coupled between the first capacitor terminal and a third capacitor terminal, the third capacitor terminal coupled to an output; and
a transistor and a fourth switch coupled between the second capacitor terminal and a second reference terminal, the transistor having a control terminal coupled to a fourth capacitor terminal, the fourth capacitor terminal coupled to a second input.

2. The charge pump circuit of claim 1, further comprising a fifth switch coupled between the second capacitor terminal and the fourth capacitor terminal.

3. The charge pump circuit of claim 2, wherein:
the transistor is a first transistor; and
the charge pump circuit includes a second transistor coupled between the second capacitor terminal and the fifth switch, the second transistor having a control terminal coupled to the second capacitor terminal.

4. The charge pump circuit of claim 3, further comprising a resistor coupled between the second capacitor terminal and the second transistor.

5. The charge pump circuit of claim 3, wherein the first transistor and the second transistor are natural transistors.

6. The charge pump circuit of claim 2, wherein:
the first switch has a first switch control input;
the second switch has a second switch control input;
the third switch has a third switch control input;

the fourth switch has a fourth switch control input;
the fifth switch has a fifth switch control input; and
the charge pump circuit includes a clock generator having:
a first clock phase output coupled to the first switch control input and the second switch control input;
a second clock phase output coupled to the fourth switch control input; and
a third clock phase output coupled to the third switch control input and the fifth switch control input.

7. The charge pump circuit of claim 1, further comprising a threshold level shift circuit coupled between the first switch and the first reference terminal.

8. The charge pump circuit of claim 7, wherein the threshold level shift circuit includes:
a voltage compensation circuit including:
a first current mirror circuit including a first control transistor and a first mirror transistor;
a first transistor coupled between the first control transistor and the first reference terminal; and
a second transistor coupled between the first mirror transistor and the first reference terminal.

9. The charge pump circuit of claim 8, wherein the threshold level shift circuit includes:
a temperature compensation circuit including:
a second current mirror circuit including a second control transistor and a second mirror transistor, in which:
the second mirror transistor is coupled between first switch and the first reference terminal;
the second control transistor is coupled between the second transistor and the first reference terminal; and
a proportional-to-absolute-temperature (PTAT) current source coupled to the second control transistor and the second transistor.

10. The charge pump circuit of claim 9, wherein:
the second control transistor includes a first control input and the second mirror transistor includes a second control input;
the temperature compensation circuit includes:
a trim current source coupled between the PTAT current source and the first reference terminal; and
a low-pass filter circuit coupled between the first control input and the second control input.

11. The charge pump circuit of claim 1, further comprising a first capacitor coupled between the first and second capacitor terminals, and a second capacitor coupled between the third and fourth capacitor terminals.

12. A charge pump circuit comprising:
a first capacitor and a second capacitor;
a first switch coupled between a top plate of the first capacitor and first voltage input terminal;
a second switch coupled between the top plate of the first capacitor and a top plate of the second capacitor; and
a threshold level shift circuit coupled between the first switch and a reference voltage terminal, the threshold level shift circuit including:
a proportional-to-absolute-temperature (PTAT) current source; and
a current mirror circuit including a control transistor and a mirror transistor, in which:
the mirror transistor is coupled between first switch and the reference voltage terminal; and
the control transistor is coupled between the PTAT current source and the reference voltage terminal.

13. The charge pump circuit of claim 12, wherein the threshold level shift circuit includes a trim current source coupled between the PTAT current source and the reference voltage terminal.

14. The charge pump circuit of claim 12, wherein:
the control transistor includes a first control input and the mirror transistor includes a second control input; and
the threshold level shift circuit includes a low-pass filter circuit coupled between the first control input and the second control input.

15. The charge pump circuit of claim 12, wherein:
the current mirror circuit is a first current mirror circuit;
the control transistor is a first control transistor, and the mirror transistor is a first mirror transistor; and
the threshold level shift circuit includes:
a second current mirror circuit including a second control transistor and a second mirror transistor;
a first transistor coupled between the second control transistor and the reference voltage terminal; and
a second transistor coupled between the second mirror transistor and the first control transistor.

16. The charge pump circuit of claim 12, further comprising:
a third switch coupled between a bottom plate of the first capacitor and the reference voltage terminal; and
a transistor and fourth switch coupled in series between the bottom plate of the first capacitor and a second voltage input terminal, in which the transistor has a control terminal, and the control terminal and a bottom plate of the second capacitor are coupled to a third voltage input terminal.

17. The charge pump circuit of claim 16, wherein:
the transistor is a first transistor;
the control terminal is a first control terminal; and
the charge pump circuit includes a fifth switch, a second transistor and a resistor, in which:
the fifth switch is coupled between the bottom plate of the second capacitor and the second transistor;
the second transistor is coupled between the resistor and the fifth switch; and the second transistor has a second control terminal coupled to the bottom plate of the first capacitor; and
the resistor is coupled between the bottom plate of the first capacitor and the second transistor.

18. The charge pump circuit of claim 17, wherein:
the first switch has a first switch control input;
the second switch has a second switch control input;
the third switch has a third switch control input;
the fourth switch has a fourth switch control input;
the fifth switch has a fifth switch control input; and
the charge pump circuit includes a clock generator having:
a first clock phase output coupled to the first switch control input and the second switch control input;
a second clock phase output coupled to the fourth switch control input; and
a third clock phase output coupled to the third switch control input and the fifth switch control input.

19. A circuit comprising:
a first transistor coupled between a power input terminal and a power output terminal, the first transistor having a first control terminal;
an amplifier having a first amplifier input, a second amplifier input, and an amplifier output, in which the first amplifier input is coupled to the power output terminal and the second amplifier input is coupled to a reference voltage circuit; and a charge pump circuit including:
a first capacitor having a first top plate and a first bottom plate;
a second capacitor having a second top plate and a second bottom plate, in which the second top plate is coupled to the first control terminal;
a first switch coupled between the first top plate and the power output terminal, the first switch having a first control input;
a second switch coupled between the first bottom plate and a reference voltage terminal, the second switch having a second control input;
a third switch coupled between the first top plate and the second top plate, the third switch having a third control input;
a second transistor and fourth switch coupled in series between the first bottom plate and a voltage input terminal, the fourth switch having a fourth control input;
a clock generator having:
a first clock phase output coupled to the first control input and the second control input;
a second clock phase output coupled to the fourth control input; and
a third clock phase output coupled to the third control input.

20. The circuit of claim 19, wherein:
the charge pump circuit includes a fifth switch, a third transistor and a resistor, in which:
the fifth switch is coupled between the second bottom plate and the third transistor, the fifth switch having a fifth control input coupled to the third clock phase output;
the second transistor is coupled between the resistor and the fifth switch; and the second transistor has a second control terminal coupled to the first bottom plate; and
the resistor is coupled between the first bottom plate and the second transistor.

21. The circuit of claim 20, wherein the second transistor and the third transistor are natural transistors.

22. The circuit of claim 19, wherein the charge pump circuit includes a threshold level shift circuit coupled between the first switch and the reference voltage terminal.

23. The circuit of claim 22, wherein the threshold level shift circuit includes:
a voltage compensation circuit including:
a first current mirror circuit including a first control transistor and a first mirror transistor;
a third transistor coupled between the first control transistor and the reference voltage terminal; and
a fourth transistor coupled between the first mirror transistor and the reference voltage terminal.

24. The circuit of claim 23, wherein the threshold level shift circuit includes:
a temperature compensation circuit including:
a second current mirror circuit including a second control transistor and a second mirror transistor, in which:
the second mirror transistor is coupled between first switch and the reference voltage terminal;
the second control transistor is coupled between the second transistor and the reference voltage terminal; and
a proportional-to-absolute-temperature (PTAT) current source coupled to the second control transistor and the second transistor.

25. The circuit of claim 24, wherein:

the second control transistor includes a first control terminal and the second mirror transistor includes a second control terminal;

the temperature compensation circuit includes:

a trim current source coupled between the PTAT current source and the reference voltage terminal; and a low-pass filter circuit coupled between the first control terminal and the second control terminal.

\* \* \* \* \*